(12) United States Patent
Xiao et al.

(10) Patent No.: US 10,310,546 B2
(45) Date of Patent: Jun. 4, 2019

(54) ARBITRARY WAVEFORM GENERATOR BASED ON INSTRUCTION ARCHITECTURE

(71) Applicant: UNIVERSITY OF ELECTRONIC SCIENCE AND TECHNOLOGY OF CHINA, Chengdu, Sichuan (CN)

(72) Inventors: Yindong Xiao, Chengdu (CN); Guangkun Guo, Chengdu (CN); Ke Liu, Chengdu (CN); Junwu Zhang, Chengdu (CN); Houjun Wang, Chengdu (CN); Jianguo Huang, Chengdu (CN); Shulin Tian, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 34 days.

(21) Appl. No.: 15/730,407

(22) Filed: Oct. 11, 2017

(65) Prior Publication Data

US 2018/0032099 A1 Feb. 1, 2018

(30) Foreign Application Priority Data

Aug. 8, 2017 (CN) .......................... 2017 1 0671156

(51) Int. Cl.
*G06F 1/02* (2006.01)
*G06F 15/78* (2006.01)
(Continued)

(52) U.S. Cl.
CPC .......... *G06F 1/0328* (2013.01); *G06F 1/0321* (2013.01); *H03K 4/026* (2013.01);
(Continued)

(58) Field of Classification Search
CPC ........ G06F 1/0328; G06F 1/0321; G06F 1/02; G06F 1/022; G06F 5/06; G06F 5/065; G06F 15/7842; G06F 3/0601; G06F 3/0607; G06F 13/28; G01R 31/2841; H03K 4/026; G10H 1/0066; G10H 1/12; G10H 5/07; G10H 2250/475; G10H 7/002; G10H 7/02; G10H 7/10; G10H 7/105; G10H 7/12
(Continued)

(56) References Cited

U.S. PATENT DOCUMENTS 4,222,108 A 9/1980 Braaten
4,649,783 A * 3/1987 Strong .................... G10H 7/02
84/606
(Continued)

*Primary Examiner* — Daniel H Pan
(74) *Attorney, Agent, or Firm* — Oliff PLC

(57) ABSTRACT

The present invention provides an arbitrary waveform generator based on instruction architecture. To deal with the feature that the instructions and waveform data of the AWG are coupled in the prior art, an instruction set based waveform synthesis controller is employed, and substitutes for the sequence wave generator in the present invention, i.e. an arbitrary waveform generator based on instruction architecture. Thus the time-sharing scheduling in reading the waveform synthesis instruction and the segment waveform data is realized, and the complexity of the hardware is reduced, so that the AWG in present invention can synthesize and generate a complex sequence wave rapidly and efficiently.

3 Claims, 4 Drawing Sheets

(51) Int. Cl.
*H03K 4/02* (2006.01)
*G01R 31/28* (2006.01)
*G10H 1/12* (2006.01)
*G06F 1/03* (2006.01)
*G06F 13/28* (2006.01)

(52) U.S. Cl.
CPC .......... *G01R 31/2841* (2013.01); *G06F 13/28* (2013.01); *G06F 15/7842* (2013.01); *G10H 1/12* (2013.01)

(58) Field of Classification Search
USPC ....... 712/36, 220, 225, 227, 248; 710/22, 35
See application file for complete search history.

(56) References Cited

U.S. PATENT DOCUMENTS

| | | | |
|---|---|---|---|
| 4,956,798 A | | 9/1990 | Dinteman |
| 6,040,515 A | * | 3/2000 | Mukojima ........... G10H 1/0066 84/603 |
| RE37,367 E | * | 9/2001 | Wachi .................. G10H 7/004 84/603 |
| 6,535,772 B1 | * | 3/2003 | Miyamori ........... G10H 1/0041 700/17 |
| 8,166,283 B2 | | 4/2012 | Cauchy |
| 8,565,811 B2 | * | 10/2013 | Tan ........................ G06F 13/28 455/550.1 |

* cited by examiner

ARBITRARY WAVEFORM GENERATOR BASED ON INSTRUCTION ARCHITECTURE

FIELD OF THE INVENTION

This application claims priority under the Paris Convention to Chinese Patent Application No. 201710671156.6, Filed Aug. 8, 2017, the entirety of which is hereby incorporated by reference for all purposes as if fully set forth herein.

The present invention relates to the field of arbitrary waveform generator, more particularly to an arbitrary waveform generator based on instruction architecture, which can generate various complex sequence waves.

BACKGROUND OF THE INVENTION

Arbitrary waveform generator (AWG) is a type of signal source which develops very quickly in recent years. It can not only generate various standard waveforms, such as sinusoidal wave and square wave, which can be generated by general signal source, but also can generate various modulation signals, such as frequency shift amplitude modulation signal. In addition, as AWG has the advantages of generating continuous phase waveform, high stability of waveform quality, high frequency resolution, high bandwidth and so on, it is widely used in the areas of disk drive test, serial data communication, baseband/IF modulation test, simulations of Anti-lock Brake System (ABS), engine control, frequency converter and biological medicine.

In U.S. Pat. No. 8,166,283 B2, which is granted on Apr. 24, 2012, an arbitrary waveform generator based on instruction architecture is put forward with the title of generator of a signal with an adjustable waveform. The AWG does not distinguish between instructions and waveform data. The instructions and waveform data of the AWG are stored in the same storage address, i.e. coupled. And the feature of instruction's addressable operation is not exploited in the AWG Thus, the AWG can only be applied to simple wave's synthesis, and not suitable for the efficient synthesis and generation of the complex sequence wave.

SUMMARY OF THE INVENTION

The present invention aims to overcome the deficiencies of the prior art and provides an arbitrary waveform generator based on instruction architecture to synthesize and generate a complex sequence wave rapidly and efficiently.

To achieve these objectives, in accordance with the present invention, an arbitrary waveform generator based on instruction architecture is provided, comprising:

a host computer for generating a corresponding waveform synthesis instruction based on the waveform characteristics input by user;

a synthesis device for performing waveform synthesis according to the waveform synthesis instruction generated by the host computer, and outputting a complex sequence wave;

wherein the synthesis device comprises an instruction set based waveform synthesis controller (hereinafter referred as waveform synthesis controller), a memory, a storage control module, a DMA control module, a FIFO module, an output control module, a digital-analog conversion module and an output conditioning module;

the waveform synthesis instruction generated by the host computer is sent to the synthesis device, and received by the waveform synthesis controller; after receiving the waveform synthesis instruction, the waveform synthesis controller parses the waveform synthesis instruction into a trigger control command and a DMA command, and the trigger control command is sent to the output control module, the DMA command is sent to the DMA control module;

the DMA control module receives and parses the DMA command to get a waveform data read control command, and sends the waveform data read control command to the storage control module; the storage control module addresses in the memory according to the waveform data read control command, and transfers the waveform data of the corresponding segment address, i.e. segment waveform data to the FIFO module through the DMA control module; the segment waveform data is buffered by the FIFO module, then sent to the output control module;

according to the inputted trigger signal and the trigger control command, the output control module completes the trigger function of the waveform data generation, and sends the segment waveform data to the digital-analog conversion module continuously; the digital-analog conversion module converts the segment waveform data into an analog signal, and then the analog signal is conditioned, i.e. filtered, amplified or attenuated through the output conditioning module to obtain the complex sequence wave, thus the waveform synthesis is completed.

The objectives of the present invention are realized as follows:

To deal with the feature that the instructions and waveform data of the AWG are coupled in the prior art, an instruction set based waveform synthesis controller is employed, and substitutes for the sequence wave generator in the present invention, i.e. an arbitrary waveform generator based on instruction architecture. Thus the time-sharing scheduling in reading the waveform synthesis instruction and the segment waveform data is realized, and the complexity of the hardware is reduced, so that the AWG in present invention can synthesize and generate a complex sequence wave rapidly and efficiently.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
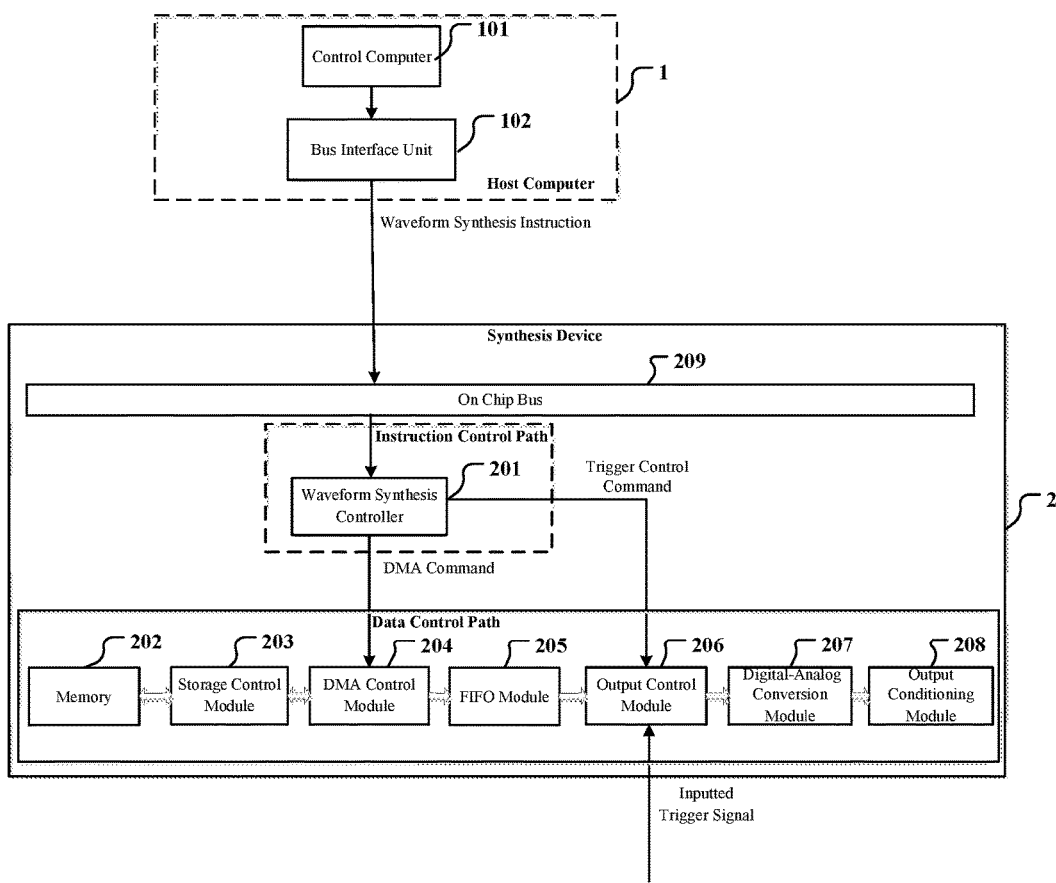
FIG. 1 is a diagram of an arbitrary waveform generator based on instruction architecture according to one embodiment of the present invention.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

FIG. 1 is a diagram of an arbitrary waveform generator based on instruction architecture according to one embodiment of the present invention;

In one embodiment, as shown in FIG. 1, the arbitrary waveform generator based on instruction architecture comprises a host computer 1 and a synthesis device 2. The host computer 1 generates a corresponding waveform synthesis instruction based on the waveform characteristics input by user, and then sends it to the synthesis device 2. Where the host computer 1 can be any type of computing unit.

As shown in FIG. 1, the host computer 1 comprises a control computer 101 and a bus interface unit 102. The control computer 101 converts the waveform characteristics input by user into a corresponding waveform synthesis instruction, and sends it to the synthesis device 2 through the bus interface unit 102.

The synthesis device 2 performs waveform synthesis according to the received waveform synthesis instruction, and outputs a complex sequence wave. The synthesis device 2 comprises an instruction set based waveform synthesis controller 201 (hereinafter referred by waveform synthesis controller), a memory 202, a storage control module 203, a DMA control module 204, a FIFO module 205, an output control module 206, a digital-analog conversion module 207, an output conditioning module 208 and a on chip bus 209.

As shown in FIG. 1, the waveform synthesis controller's parsing of waveform synthesis instruction forms an instruction control path. the waveform synthesis instruction which the host computer 1 sends to the synthesis device 2 through the on chip bus 209 is received by the waveform synthesis controller 201. After receiving the waveform synthesis instruction, the waveform synthesis controller 201 parses the waveform synthesis instruction into two commands, i.e. a trigger control command and a DMA command, and sends the trigger control command to the output control module, the DMA command to the DMA control module.

As shown in FIG. 1, the memory 202, the storage control module 203, the DMA control module 204, the FIFO module 205, the output control module 206, the digital-analog conversion module 207 and the output conditioning module 208 form a data control path. The DMA control module 204 receives and parses the DMA command to get a waveform data read control command, and sends the waveform data read control command to the storage control module 203. The segment waveform data is generated by the host computer 1 based on the waveform characteristics input by user, and stored in the memory 202. The storage control module 203 addresses in the memory 202 according to the waveform data read control command, and transfers the waveform data of the corresponding segment address, i.e. segment waveform data to the FIFO module 205 through the DMA control module 204; the segment waveform data is buffered by the FIFO module 205, then sent to the output control module 206.

According to the inputted trigger signal and the trigger control command, the output control module 206 completes the trigger function of the waveform data generation, and sends the segment waveform data to the digital-analog conversion module 207 continuously. The digital-analog conversion module 207 converts the segment waveform data into an analog signal, and then the analog signal is conditioned, i.e. filtered, amplified or attenuated through the output conditioning module 208 to obtain the complex sequence wave, thus the waveform synthesis is completed.

Figure 2:
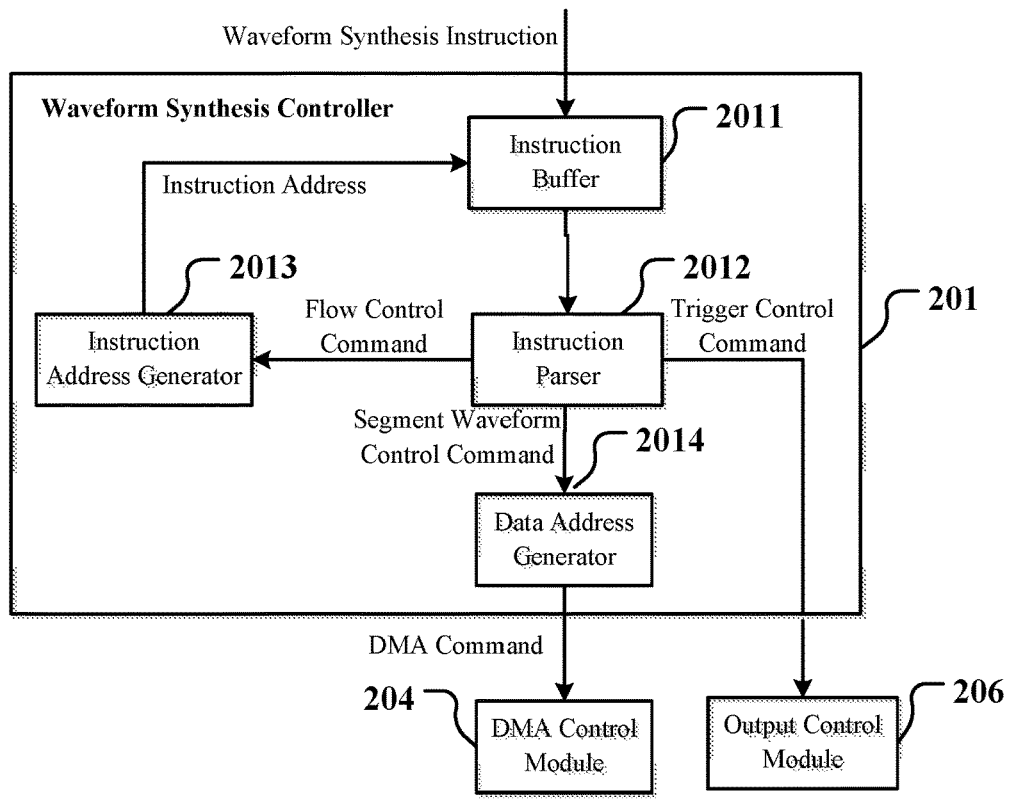
FIG. 2 is a diagram of the waveform synthesis controller for waveform synthesis shown in FIG. 1 according to one embodiment of the present invention.

FIG. 2 is a diagram of the instruction set based waveform synthesis controller shown in FIG. 1 according to one embodiment of the present invention.

In one embodiment, as shown in FIG. 1, the instruction set based waveform synthesis controller 201 comprises an instruction buffer 2011, an instruction parser 2012, an instruction address generator 2013 and a data address generator 2014, where the instruction buffer 2011 can be in or not in the same memory with segment waveform data memory, i.e. the memory 202, and is used for storing the waveform synthesis instruction sent by the host computer 1, fetching out the waveform synthesis instruction which needs to be executed according to the instruction address sent by the instruction address generator 2013, and sending the waveform synthesis instruction to the instruction parser 2012; the instruction parser 2012 parses the waveform synthesis instruction into a flow control command, a segment waveform control command and a trigger control command; the flow control command is sent to the instruction address generator 2013, the segment waveform control command is sent to the data address generator 2014; the trigger control command is sent to the output control module 206.

The instruction address generator 2013 generates an instruction address of the next waveform synthesis instruction for the instruction buffer 2011, executing the waveform synthesis instruction in sequence, or in jump according to the flow control command; the data address generator 2014 generates a DMA command according to the segment waveform control command sent by the instruction parser 2012, and sends the DMA command to the DMA control module 204, thus the reading control of a segment waveform data is completed.

Figure 3:
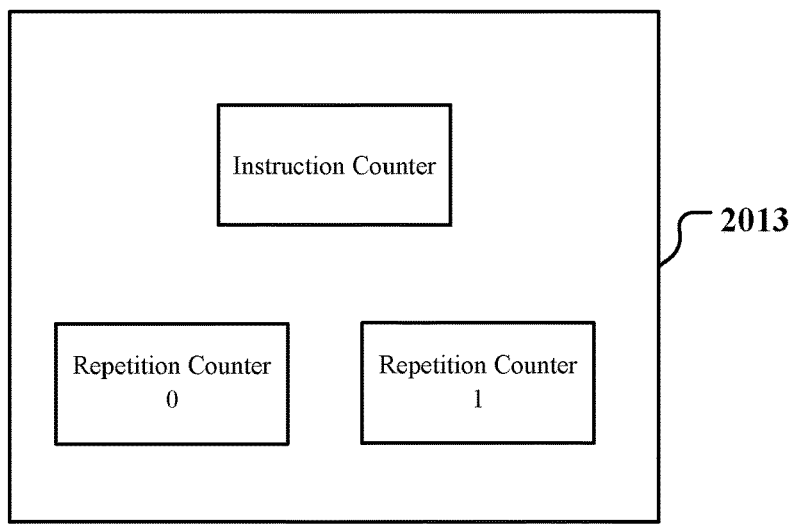
FIG. 3 is a diagram of the instruction address generator shown in FIG. 2 according to one embodiment of the present invention.

As shown in FIG. 3, the instruction address generator 2013 comprises an instruction counter and a repetition counter 0 and a repetition counter 1, where the instruction counter generates a memory address of the next waveform synthesis instruction, i.e. instruction address for the instruction buffer 2011 in sequence, or in jump according to the logical judgment of the flow control command, the repetition counter 0 is a read-only register for realizing an unconditional jump of the instruction, its store value is always 0; the repetition counter 1 is a readable and writable register for realizing a conditional jump of the instruction by counting the number of sequence wave.

The flow control command comprises an instruction's jump address, a repetition counter number and a jump number; when the waveform synthesis instruction is a jump instruction, the instruction parser 202 parses the jump instruction and obtains an flow control command, the flow control command is sent to the instruction address generator 2013; the instruction address generator 2013 judges according to flow control command, if the repetition counter number in the flow control command is 0, the jump is an unconditional jump, the instruction counter is assigned the jump instruction address; if the repetition counter number is 1, the jump is a conditional jump, the store value of the repetition number counter 1 is increased by 1, then the store value of the repetition number counter 1 is compared with the jump number for further judgment: if the store value of the repetition number counter 1 is less than the jump number, the instruction counter is assigned the instruction's jump address, i.e. jumps to the instruction's jump address which the flow control command designates, if the store value of the repetition number counter 1 equals to the jump number, the instruction counter in the instruction address generator 2013 is increased by 1, i.e. the next waveform synthesis instruction is fetched from the instruction buffer in sequence, meanwhile, the count value of repetition number counter 1 is reset to 0.

In the process of implementing the present invention, the number of the repetition counters can increase according to the complexity of the outputted complex sequence wave, i.e. the instruction address generator 2013 may comprise a plurality of repetition counters, which are readable and writable registers for counting more complex sequence wave and realizing the waveform sequence's nested call in complex sequence wave.

In one embodiment, the instruction format of a jump instruction is: JUMP InstructionAddress K N, which is used to realize an unconditional jump instruction or a conditional jump instruction, where JUMP is the operation code of the jump instruction. InstructionAddress, K, and N are operands, InstructionAddress is a instruction's jump address, K is a repetition counter number in the instruction address generator 2013, N is a jump number. When executing the jump instruction, the store value of the repetition number counter K is increased by 1, then the store value of the repetition number counter K is compared with the jump number, if the store value of the repetition number counter K is less than the jump number, the instruction counter is assigned the instruction's jump address InstructionAddress, and the waveform synthesis instruction is fetched out from the instruction buffer 2011 at the instruction's jump address InstructionAddress, if the store value of the repetition number counter 1 equals to the jump number N, the instruction counter of the instruction address generator 2013 is increased by 1, i.e. the next waveform synthesis instruction is fetched from the instruction buffer 2011 in sequence, meanwhile, the count value of repetition number counter K is reset to 0.

To realize unconditional jump and conditional jump in one jump instruction, when executing an unconditional jump instruction, the repetition counter number K is 0, the register to be operated is the repetition counter 0 of the instruction address generator 2013. The repetition counter 0 is a read-only register, when executing an unconditional jump instruction to add 1 to the register, i.e. the repetition counter 0, the store value of the repetition counter 0 is not changed, i.e. remains 0. Thus when comparing with the jump number, the store value of the repetition number counter 0 is always less than the jump number. Therefore, when executing an unconditional jump instruction, the instruction counter is assigned the instruction's jump address InstructionAddress to realize an unconditional jump. When executing a conditional jump instruction, the repetition number counter K is 1 to P, and all repetition counter numbers are readable and writable registers, the store value of the repetition number counter K is increased by 1, then the store value of the repetition number counter K is compared with the jump number N, if the store value of the repetition number counter K is less than the jump number, the instruction counter is assigned the instruction's jump address InstructionAddress, and the waveform synthesis instruction is fetched out from the instruction buffer 2011 at the instruction's jump address InstructionAddress; if the store value of the repetition number counter K equals to the jump number N, the instruction counter of the instruction address generator 2013 is increased by 1, i.e. the next waveform synthesis instruction is fetched out from the instruction buffer 2011 in sequence, meanwhile, the count value of repetition number counter K is reset to 0. The conditional jump instruction takes that whether the store value of the repetition number counter K is less than the jump number as a jump judgment to realize the conditional jump.

Figure 4:
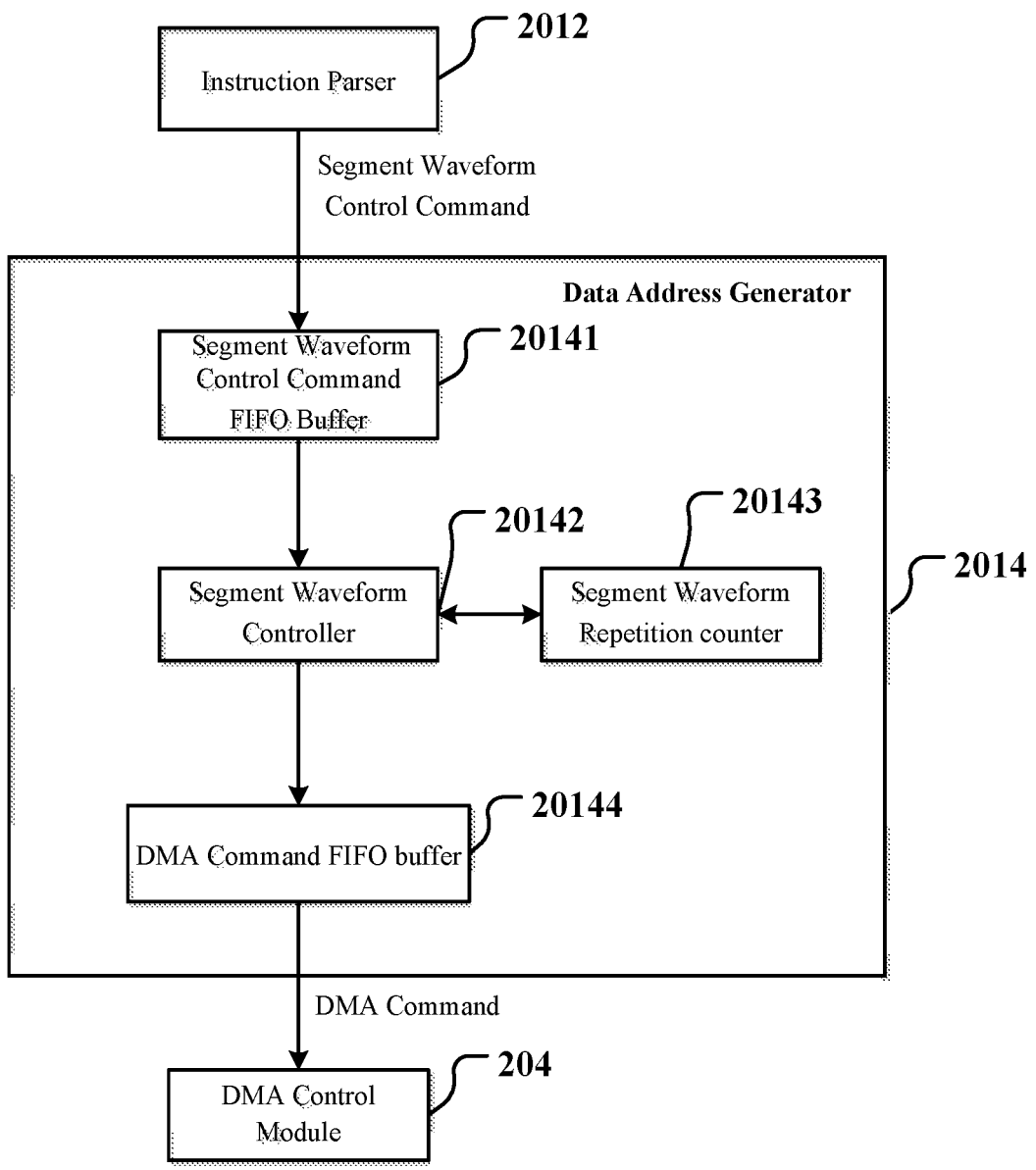
FIG. 4 is a diagram of the data address generator shown in FIG. 2 according to one embodiment of the present invention.

In one embodiment, as shown in FIG. 4, the data address generator 2014 comprises a segment waveform control command FIFO buffer 20141, a segment waveform controller 20142, a segment waveform repetition counter 20143 and a DMA command FIFO buffer 20144. The segment waveform control command FIFO buffer 20141 buffers the segment waveform control command sent from the instruction parser 2012. The segment waveform control command comprises a start address of segment waveform data, a length of segment waveform data and a repetitions of segment waveform. the segment waveform controller 20142 fetches out the segment waveform control command from the segment waveform control command FIFO buffer 20141 and parses it to obtain the start address of segment waveform data, the length of segment waveform data and the repetitions M of segment waveform, and generates a DMA command according to the start address of segment waveform data and the length of segment waveform data. The DMA command is sent to the DMA command FIFO buffer 20144 continuously, and the store value of the segment waveform repetition counter 20143 is increased by 1 at each sending. When the store value of the segment waveform repetition counter 20143 equals to the repetitions M, the sending of the DMA command is stopped, the store value of the segment waveform repetition counter 20143 is reset to 0. Meanwhile, the segment waveform controller 20142 fetches out the next segment waveform control command from the segment waveform control command FIFO buffer 20141 to perform the next segment waveform's synthesis. the DMA command FIFO buffer 20144 buffers the DMA command sent from the segment waveform controller 20142. when completing the sending of a waveform data read control command, the DMA control module 204 fetches out the next DMA command from the DMA command FIFO buffer 20144.

Figure 5:
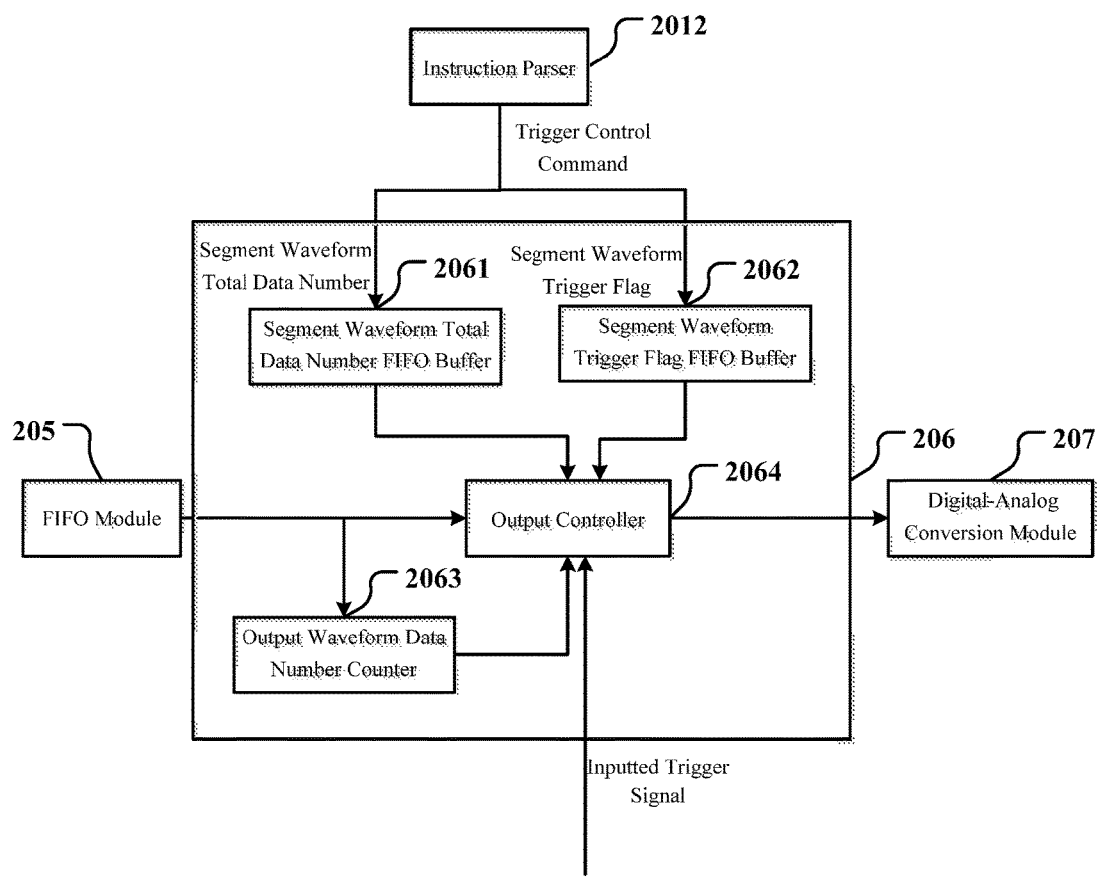
FIG. 5 is a diagram of the output control module shown in FIG. 1 according to one embodiment of the present invention.

In one embodiment, as shown in FIG. 5, the output control module 206 comprises a segment waveform total data number FIFO buffer 2061, a segment waveform trigger flag FIFO buffer 2062, an output waveform data number counter 2063 and an output controller 2064. the instruction parser 2012 sends the trigger control command to the output control module 206, where the trigger control command is comprised of a segment waveform total data number, i.e Length*M (the total length of waveform data corresponding to a waveform synthesis instruction) and a segment waveform trigger flag. the segment waveform total data number FIFO buffer 2061 buffers the segment waveform total data number, the segment waveform trigger flag FIFO buffer 2062 buffers the segment waveform trigger flag, the output waveform data number counter 2063 counts the data number outputted by current segment waveform. When the count value equals to the current segment waveform total data number fetched out from the segment waveform total data number FIFO buffer 2061, a waveform synthesis instruction is finished. Then the next segment waveform total data number is fetched out from the segment waveform total data number FIFO buffer 2061, the next segment waveform trigger flag is fetched out from the segment waveform trigger flag FIFO buffer 2062, meanwhile, the count value of the output waveform data number counter 2063 is reset to 0. the output controller 2064 controls the on-off of the sending from the FIFO module 205 to the digital-analog conversion module 207 according to the current segment waveform trigger flag fetched out from the segment waveform trigger flag FIFO buffer 2062: the output controller 2064 judges the current segment waveform trigger flag fetched out from the segment waveform trigger flag FIFO buffer 2062, if the current segment waveform trigger flag is non-trigger flag, the output controller 2064 opens the segment waveform data's transmission path, the segment waveform data buffered in FIFO module 205 is sent to the digital-analog conversion module 207 through the output controller 2064; if the current segment waveform trigger flag is trigger flag, the output controller 2064 closes the segment waveform data's transmission path, until the inputted trigger signal arrives, the segment waveform data buffered in FIFO module 205 is sent to the digital-analog conversion module 207 through the output controller 2064 once again, thus the trigger function is completed.

In one embodiment accordance with the present invention, the waveform synthesis instruction's instruction set of the arbitrary waveform generator based on instruction architecture comprise segment waveform synthesis instructions and jump instructions, where the instruction format of a segment waveform synthesis instruction is:

SEGMENT DataAddress Length M F

The segment waveform synthesis instruction is used to generate a segment waveform M times, SEGMENT is the operation code to identify the segment waveform synthesis instruction, DataAddress, Length, M and F are operands, where DataAddress is the start address of the segment waveform, Length is the length of the segment waveform, M is the repetitions of the segment waveform, and F is the segment waveform trigger flag; when the segment waveform trigger flag F is 0, it indicates that the output of the output control module does not need to wait the inputted trigger signal; when the segment waveform triggers the flag F is 1, it indicates that the output of the output control module needs to wait inputted trigger signal.

The instruction format of the jump instruction is:

JUMP InstructionAddress K N

The jump instruction is used to realize an unconditional jump instruction or a conditional jump instruction, where JUMP is the operation code of the jump instruction, InstructionAddress, K, and N are operands, instructionAddress is a instruction's jump address, K is a repetition counter number in the instruction address generator 2013, N is a jump number; When executing the jump instruction, if K is not equal to 0, the jump instruction is conditional jump instruction, the store value of the repetition number counter K is increased by 1, then the store value of the repetition number counter K is compared with the jump number, if the store value of the repetition number counter K is less than the jump number, the instruction counter is assigned the instruction's jump address InstructionAddress, and the waveform synthesis instruction is fetched out from the instruction buffer 2011 at the instruction's jump address InstructionAddress; if the store value of the repetition number counter K equals to the jump number N, the instruction counter of the instruction address generator 2013 is increased by 1, i.e. the next waveform synthesis instruction is fetched out from the instruction buffer 2011 in sequence. Meanwhile, the count value of repetition number counter K is reset to 0. If K is equal to 0, the jump instruction is unconditional jump instruction, the store value of the repetition counter 0 is 0, the store value of the repetition number counter 0 is less than the jump number N, the instruction counter is assigned the instruction's jump address InstructionAddress, and the waveform synthesis instruction is fetched out from the instruction buffer 2011 at the instruction's jump address InstructionAddress to realize an unconditional jump.

An Example of Implementation a complex sequence wave F to be output indefinitely is synthesized in the example, the complex sequence wave F is comprised of an enhanced sequence wave Z and an enhanced sequence wave Y, the enhanced sequence wave Z is repeated twice, the enhanced sequence wave Y is repeated three times.

Where the enhanced sequence wave Z is comprised of a sequence wave A, which will be output two times, and a sequence wave B, which will be output three times; Where the sequence wave A is comprised of a segment waveform a, which will be output three times, and a segment waveform b, which will be output one time, meanwhile, the segment waveform b isn't output, until the inputted trigger signal arrives; the sequence wave B is comprised of a segment waveform c, which will be output four times, and a segment waveform d, which will be output one time. The start address of segment waveform a is DataAddress1, the length of segment waveform a is 1000, the start address of segment waveform b is DataAddress2, the length of segment waveform b is 2000, the start address of segment waveform c is DataAddress3, the length of segment waveform c is 500, the start address of segment waveform d is DataAddress4, the length of segment waveform d is 5000.

Where the enhanced sequence wave Y is comprised of a sequence wave C, which will be output two times, and a sequence wave C, which will be output three times; Where the sequence wave C is comprised of a segment waveform e, which will be output three times, and a segment waveform f, which will be output four times; The sequence wave D is comprised of a segment waveform h, which will be output five times, and a segment waveform i, which will be output two times. The start address of segment waveform e is DataAddress5, the length of segment waveform e is 1000, the start address of segment waveform f is DataAddress6, the length of segment waveform f is 2000, the start address of segment waveform h is DataAddress7, the length of segment waveform h is 500, the start address of segment waveform i is DataAddress8, the length of segment waveform i is 5000.

In the example, the waveform synthesis instructions to generate (output) the complex sequence wave F are as follows:

| Instruction address in an instruction buffer | Waveform synthesis instruction | Description |
| --- | --- | --- |
| InstructionAddress1 | SEGMENT DataAddress1 1000 3 0 | Repeatedly output segment waveform a three times |
| InstructionAddress2 | SEGMENT DataAddress2 2000 1 1 | Output segment waveform b one time, the segment waveform b isn't output, until the inputted trigger signal arrives |
| InstructionAddress3 | JUMP InstructionAddress1 1 2 | Repeatedly output sequence wave A two times |

-continued

| Instruction address in an instruction buffer | Waveform synthesis instruction | Description |
|---|---|---|
| InstructionAddress4 | SEGMENT DataAddress3 500 4 0 | Repeatedly output segment waveform c four times |
| InstructionAddress5 | SEGMENT DataAddress4 5000 1 0 | Output segment waveform d one time, |
| InstructionAddress6 | JUMP InstructionAddress4 1 3 | Repeatedly output sequence wave B three times |
| InstructionAddress7 | JUMP InstructionAddress1 2 2 | Repeatedly output the enhanced sequence wave Z two times |
| InstructionAddress8 | SEGMENT DataAddress5 1000 3 0 | Repeatedly output segment waveform e three times |
| InstructionAddress9 | SEGMENT DataAddress6 2000 4 0 | Repeatedly output segment waveform f four times |
| InstructionAddress10 | JUMP InstructionAddress8 1 2 | Repeatedly output sequence wave C two times |
| InstructionAddress11 | SEGMENT DataAddress7 500 5 0 | Repeatedly output segment waveform h five times |
| InstructionAddress12 | SEGMENT DataAddress8 5000 2 0 | Repeatedly output segment waveform i two times |
| InstructionAddress13 | JUMP InstructionAddress8 1 3 | Repeatedly output sequence wave D three times |
| InstructionAddress14 | JUMP InstructionAddress8 2 3 | Repeatedly output the enhanced sequence wave Y three times |
| InstructionAddress15 | JUMP InstructionAddress1 0 1 | Output the complex sequence wave F indefinitely, where the repetition counter 0 is a read-only register, its store value is always 0, therefore jumps at each execution of the instruction. |

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. An arbitrary waveform generator based on instruction architecture, comprising:

a host computer for generating a corresponding waveform synthesis instruction based on the waveform characteristics input by user;

a synthesis device for performing waveform synthesis according to the waveform synthesis instruction generated by the host computer, and outputting a complex sequence wave;

wherein the synthesis device comprises an instruction set based waveform synthesis controller (hereinafter referred as waveform synthesis controller), a memory, a storage control module, a DMA control module, a FIFO module, an output control module, a digital-analog conversion module and an output conditioning module;

the waveform synthesis instruction generated by the host computer is sent to the synthesis device, and received by the waveform synthesis controller; after receiving the waveform synthesis instruction, the waveform synthesis controller parses the waveform synthesis instruction into a trigger control command and a DMA command, and the trigger control command is sent to the output control module, the DMA command is sent to the DMA control module;

the DMA control module receives and parses the DMA command to get a waveform data read control command, and sends the waveform data read control command to the storage control module; the storage control module addresses in the memory according to the waveform data read control command, and transfers the waveform data of the corresponding segment address, i.e. segment waveform data to the FIFO module through the DMA control module; the segment waveform data is buffered by the FIFO module, then sent to the output control module;

according to an inputted trigger signal and a trigger control command, the output control module completes the trigger function of the waveform data generation, and sends the segment waveform data to the digital-analog conversion module continuously; the digital-analog conversion module converts the segment waveform data into an analog signal, and then the analog signal is conditioned, i.e. filtered, amplified or attenuated through the output conditioning module to obtain the complex sequence wave, thus the waveform synthesis is completed;

wherein the waveform synthesis controller comprises an instruction buffer, an instruction parser, an instruction address generator and a data address generator;

where the instruction buffer is used for storing the waveform synthesis instruction sent by the host computer, fetching out the waveform synthesis instruction which needs to be executed according to the instruction address sent by the instruction address generator, and sending the waveform synthesis instruction to the instruction parser; the instruction parser parses the waveform synthesis instruction into a flow control command, a segment waveform control command and a trigger control command; the flow control command is sent to the instruction address generator, the segment waveform control command is sent to the data address generator; the trigger control command is sent to the output control module;

the instruction address generator generates an instruction address of the next waveform synthesis instruction for the instruction buffer, executing the waveform synthesis instruction in sequence, or in jump according to the flow control command; the data address generator generates a DMA command according to the segment waveform control command sent by the instruction parser, and sends the DMA command to the DMA control module, thus the reading control of a segment waveform data is completed.

2. An arbitrary waveform generator based on instruction architecture of claim 1, wherein the instruction address generator comprises an instruction counter and a repetition counter 0 and a repetition counter 1, where the instruction counter generates a memory address of the next waveform synthesis instruction, i.e. instruction address for the instruction buffer in sequence, or in jump according to a logical judgment of the flow control command, the repetition counter 0 is a read-only register for realizing an unconditional jump of the instruction, its store value is always 0; the repetition counter 1 is a readable and writable register for realizing a conditional jump of the instruction by counting a number of the complex sequence wave;

the flow control command comprises an instruction's jump address, a repetition counter number and a jump number; when the waveform synthesis instruction is a jump instruction, the instruction parser parses the jump instruction and obtains an flow control command, the flow control command is sent to the instruction address generator; the instruction address generator judges according to flow control command, if the repetition counter number in the flow control command is 0, the jump is an unconditional jump, the instruction counter is assigned the jump instruction address; if the repetition counter number is 1, the jump is a conditional jump, the store value of the repetition number counter 1 is increased by 1, then the store value of the repetition number counter 1 is compared with the jump number for further judgment: if the store value of the repetition number counter 1 is less than the jump number, the instruction counter is assigned the instruction's jump address, i.e. jumps to the instruction's jump address which the flow control command designates, if the store value of the repetition number counter 1 equals to the jump number, the instruction counter in the instruction address generator is increased by 1, i.e. the next waveform synthesis instruction is fetched from the instruction buffer in sequence, meanwhile, the count value of repetition number counter 1 is reset to 0.

3. An arbitrary waveform generator based on instruction architecture of claim 2, wherein the instruction address generator comprises a plurality of repetition counters, which are readable and writable registers;

the waveform synthesis instruction's instruction set comprise segment waveform synthesis instructions and jump instructions, where the instruction format of a segment waveform synthesis instruction is:
SEGMENT DataAddress Length M F
the segment waveform synthesis instruction is used to generate a segment waveform M times, SEGMENT is an operation code to identify the segment waveform synthesis instruction, DataAddress, Length, M and F are operands, where DataAddress is a start address of the segment waveform, Length is the length of the segment waveform, M is the repetitions of the segment waveform, and F is a segment waveform trigger flag; when the segment waveform trigger flag F is 0, it indicates that the output of the output control module does not need to wait the inputted trigger signal; when the segment waveform triggers the flag F is 1, it indicates that the output of the output control module needs to wait inputted trigger signal;
the instruction format of the jump instruction is:
JUMP InstructionAddress K N
the jump instruction is used to realize an unconditional jump instruction or a conditional jump instruction, where JUMP is the operation code of the jump instruction, InstructionAddress, K, and N are operands, instructionAddress is a instruction's jump address, K is a repetition counter number in the instruction address generator, N is a jump number;
when executing the jump instruction, if K is not equal to 0, the jump instruction is conditional jump instruction, the store value of the repetition number counter K is increased by 1, then the store value of the repetition number counter K is compared with the jump number, if the store value of the repetition number counter K is less than the jump number, the instruction counter is assigned the instruction's jump address InstructionAddress, and the waveform synthesis instruction is fetched out from the instruction buffer at the instruction's jump address InstructionAddress; if the store value of the repetition number counter K equals to the jump number N, the instruction counter of the instruction address generator is increased by 1, i.e. the next waveform synthesis instruction is fetched out from the instruction buffer in sequence; meanwhile, the count value of repetition number counter K is reset to 0;
if K is equal to 0, the jump instruction is unconditional jump instruction, the store value of the repetition counter 0 is 0, the store value of the repetition number counter 0 is less than the jump number N, the instruction counter is assigned the instruction's jump address InstructionAddress, and the waveform synthesis instruction is fetched out from the instruction buffer at the instruction's jump address InstructionAddress to realize an unconditional jump.

* * * * *